United States Patent
Kim et al.

(10) Patent No.: US 8,551,846 B2
(45) Date of Patent: Oct. 8, 2013

(54) METHODS FOR FABRICATING SEMICONDUCTOR DEVICES

(75) Inventors: Dong Hyuk Kim, Seongnam-si (KR);
Dongsuk Shin, Yongin-si (KR);
Myungsun Kim, Hwaseong-si (KR);
Hoi Sung Chung, Hwaseong-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 83 days.

(21) Appl. No.: 13/427,411

(22) Filed: Mar. 22, 2012

(65) Prior Publication Data
US 2012/0244674 A1    Sep. 27, 2012

(30) Foreign Application Priority Data
Mar. 23, 2011 (KR) .................. 10-2011-0026053

(51) Int. Cl.
*H01L 21/336* (2006.01)

(52) U.S. Cl.
USPC ............ 438/300; 257/E21.223; 257/E21.232; 257/E21.335; 257/E21.431; 257/E21.43; 438/187; 438/198; 438/299; 438/303; 438/705; 438/733; 438/735; 438/749; 438/753

(58) Field of Classification Search
USPC .................. 257/E21.223, E21.232, E21.335, 257/E21.431, E21.43; 438/187, 198, 299, 438/300, 303, 705, 733, 735, 749, 753
See application file for complete search history.

(56) References Cited

U.S. PATENT DOCUMENTS

| | | | |
|---|---|---|---|
| 7,045,407 B2 | 5/2006 | Keating et al. | |
| 7,494,858 B2 | 2/2009 | Bohr et al. | |
| 7,732,285 B2 | 6/2010 | Sell et al. | |
| 2005/0285203 A1 | 12/2005 | Fukutome et al. | |
| 2012/0132957 A1* | 5/2012 | Sung et al. | 257/192 |
| 2013/0092954 A1* | 4/2013 | Yang et al. | 257/77 |

FOREIGN PATENT DOCUMENTS

| | | |
|---|---|---|
| JP | 2006-013082 | 1/2006 |
| JP | 2010-027894 | 2/2010 |
| KR | 10-0580308 | 12/2005 |
| KR | 10-0810774 | 10/2006 |

* cited by examiner

*Primary Examiner* — Asok K Sarkar
(74) *Attorney, Agent, or Firm* — Muir Patent Consulting, PLLC

(57) ABSTRACT

A method of fabricating a semiconductor device includes providing a semiconductor substrate including a channel region, forming a gate electrode structure on the channel region of the semiconductor substrate, forming a first trench in the semiconductor substrate, and forming a second trench in the semiconductor device. The first trench may include a first tip that protrudes toward the channel. The second trench may be an enlargement of the first trench and may include a second tip that also protrudes toward the channel region. In some examples, the second tip may protrude further towards the channel region than the first tip.

15 Claims, 9 Drawing Sheets

METHODS FOR FABRICATING SEMICONDUCTOR DEVICES

CROSS-REFERENCE TO RELATED APPLICATIONS

This U.S. non-provisional patent application claims priority under 35 U.S.C. §119 to Korean Patent Application No. 10-2011-0026053, filed on Mar. 23, 2011, in the Korean Intellectual Property Office, the entire contents of which are hereby incorporated by reference.

BACKGROUND OF THE INVENTION

Embodiments of the present disclosure relate generally to a semiconductor device and to a method of fabricating a semiconductor device.

Increasing an integration density of a semiconductor device may improve its performance, with regard to operating speed and operating electric current. One way to improve the performance (e.g., carrier mobility) of a semiconductor device may be to induce strain or stress to a transistor channel.

SUMMARY

Embodiments of the present disclosure provide fabrication methods capable of effectively applying strain or stress to a transistor channel of a semiconductor device.

A method of fabricating a semiconductor device comprises the steps of providing a semiconductor substrate including a channel region, forming at least a first gate electrode structure on the channel region of the semiconductor substrate, forming a first trench in the semiconductor substrate at a first side of the first gate electrode structure, the first trench including at least a first plane that extends from a top surface of the semiconductor substrate, the first plane having a (111) crystal plane, at least a second plane that intersects the first plane, the second plane having a (111) crystal plane, and at least a first tip, the first tip defined by the intersection of the first plane and the second plane. The method further comprises the steps of enlarging the first trench to form a second trench, the second trench including at least a third plane that intersects the top surface of the semiconductor substrate, at least a fourth plane that intersects the third plane, and at least a second tip, the second tip defined by the intersection of the third plane and the fourth plane, wherein the step of enlarging the first trench to form the second trench comprises the step of etching the first plane and the second plane to form the third plane and the fourth plane, wherein an etch rate of the first plane is higher than an etch rate of the second plane.

A method of fabricating a semiconductor device comprises the steps of forming at least a first gate electrode structure on a surface of a silicon-containing semiconductor substrate, forming a first trench in the semiconductor substrate, the first trench including at least a first plane that intersects a top surface of the semiconductor substrate, at least a second plane that intersects the first plane, and at least a first tip formed at the intersection of the first plane and the second plane, the first tip protruding toward a channel region disposed in the semiconductor substrate under the first gate electrode. The method also includes the steps of enlarging the first trench to form a second trench, the second trench including at least a third plane that intersects the top surface of the semiconductor substrate, at least a fourth plane that intersects the third plane, and at least a second tip formed at the intersection of the third plane and the fourth plane, wherein the step of enlarging the first trench to form the second trench comprises the step of etching the first plane and the second plane to form the third plane and the fourth plane, wherein a first distance from the first tip to the top surface of the semiconductor substrate is greater than a second distance from the second tip to the top surface of the semiconductor substrate.

A semiconductor device comprises a semiconductor substrate including a channel region, at least a first gate electrode structure disposed on the semiconductor substrate, the channel region disposed under the first gate electrode structure, and a first trench disposed in the semiconductor substrate. The first trench comprises at least a first plane that intersects a top surface of the semiconductor substrate, at least a second plane that intersects the first plane, the second plane having a (111) crystal plane, and at least a first tip formed at the intersection of the first plane and the second plane, the first tip protruding toward a channel region disposed in the semiconductor substrate under the first gate electrode, wherein the first tip is formed at an angle of at least 100 degrees.

BRIEF DESCRIPTION OF THE DRAWINGS

The above and other aspects and features of the disclosure will become apparent by describing in detail exemplary embodiments thereof with reference to the attached drawings, in which:

FIGS. 1E, 1F, 1I and 1J are enlarged sectional views of an exemplary portion of the semiconductor device shown in FIG. 1D;

DETAILED DESCRIPTION

Figure 1A:
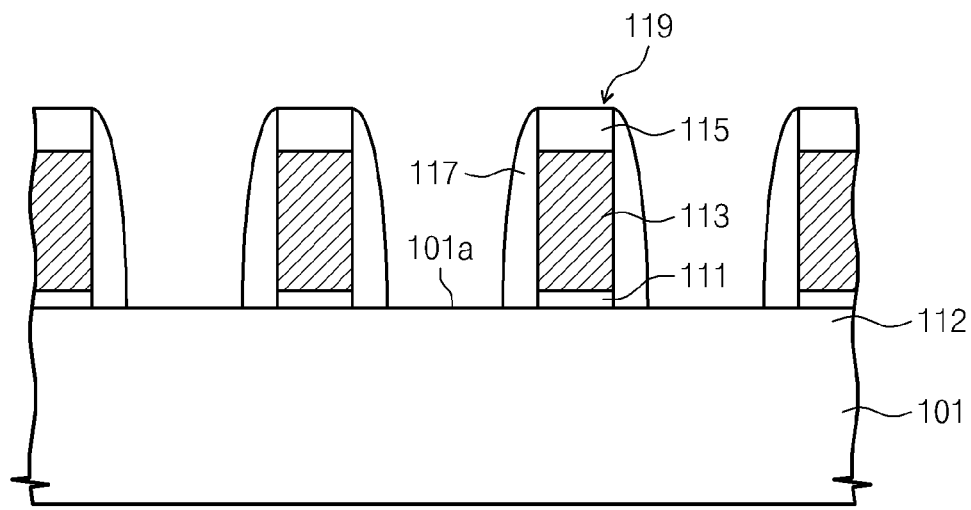
FIGS. 1A through 1H are sectional views illustrating methods of fabricating a semiconductor device according to example embodiments.

The present disclosure will now be described more fully hereinafter with reference to the accompanying drawings, in which various embodiments are shown. The invention may, however, be embodied in many different forms and should not be construed as limited to the embodiments set forth herein. In the drawings, the sizes and relative sizes of layers and regions may be exaggerated for clarity.

It will be understood that when an element or layer is referred to as being "connected" or "coupled" to another element or layer, it can be directly connected or coupled to the other element or layer, or intervening elements or layers may be present. In contrast, when an element or layer is referred to as being "directly connected" or "directly coupled" to another element or layer, there are no intervening elements or layers present. Like numbers refer to like elements throughout. As used herein the term "and/or" includes any and all combinations of one or more of the associated listed items and may be abbreviated "/". Other words used to describe the relationship between elements or layers should be interpreted in a like fashion (e.g., "between" versus "directly between;" "adjacent" versus "directly adjacent;" "on" versus "directly on").

It will be understood that, although the terms "first", "second", etc. may be used herein to describe various elements, components, regions, layers and/or sections, these elements, components, regions, layers and/or sections should not be limited by these terms. Unless indicated otherwise, these terms are only used to distinguish one element, component, region, layer or section from another element, component, region, layer or section. Thus, a first element, component, region, layer or section discussed below could be termed a second element, component, region, layer or section, and, similarly, a second element, component, region, layer or section could be termed a first element, component, region, layer or section without departing from the teachings of the disclosure.

Locational terms, such as "beneath," "below," "lower," "above," "upper" and the like, may be used herein for ease of description to describe one element or feature's relationship to another element(s) or feature(s) as illustrated in the figures. It will be understood that the locational terms may be relative to a device and are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the locational descriptors used herein interpreted accordingly.

The terminology used herein is for the purpose of describing particular embodiments only and is not intended to be limiting of example embodiments. As used herein, the singular forms "a," "an" and "the" should not exclude the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Example embodiments should not be construed as limited to those shown in the views, but include modifications in configuration formed on the basis of manufacturing processes. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures may be schematic in nature.

Unless otherwise defined, all terms (including technical and scientific terms) used herein have the same meaning as commonly understood by one of ordinary skill in the art to which this disclosure belong. It will be further understood that terms, such as those defined in commonly-used dictionaries, should be interpreted as having a meaning that is consistent with their meaning in the context of the relevant art and/or the present application and will not be interpreted in an idealized or overly formal sense unless expressly so defined herein.

Example Embodiments

Fabrication Methods

Figure 1B:
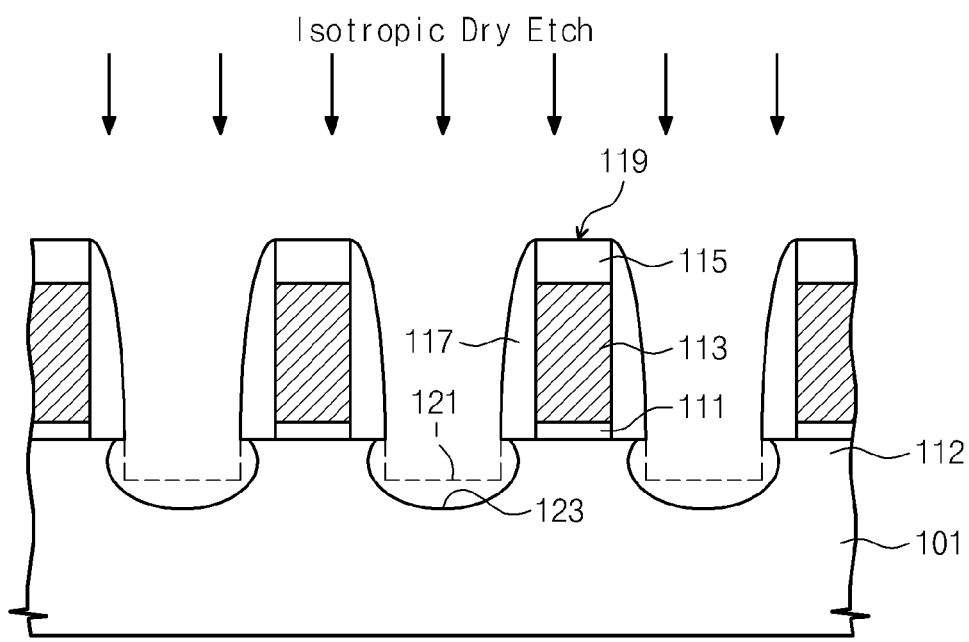
Figure 1C:
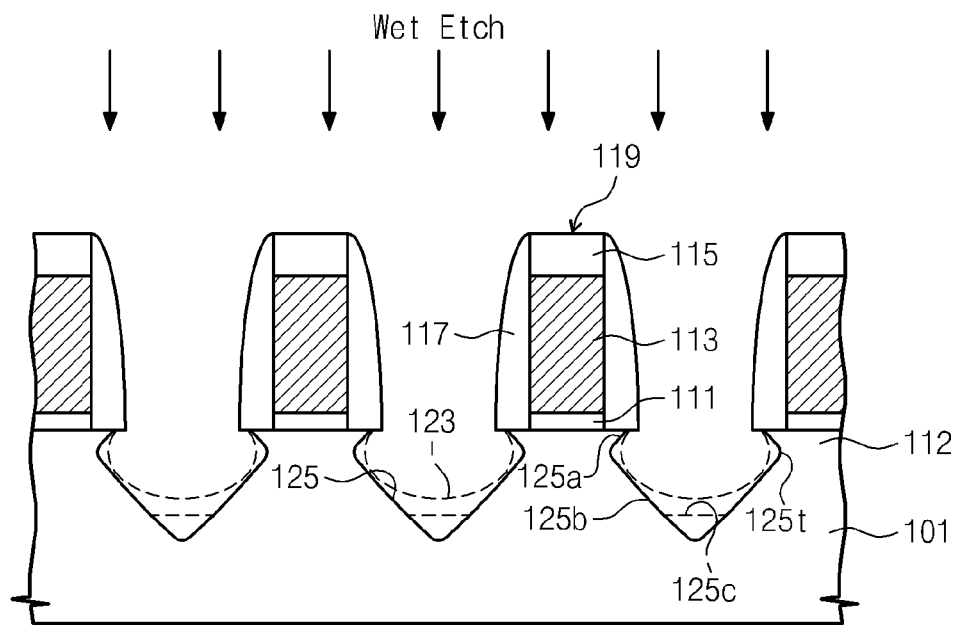
Figure 1D:
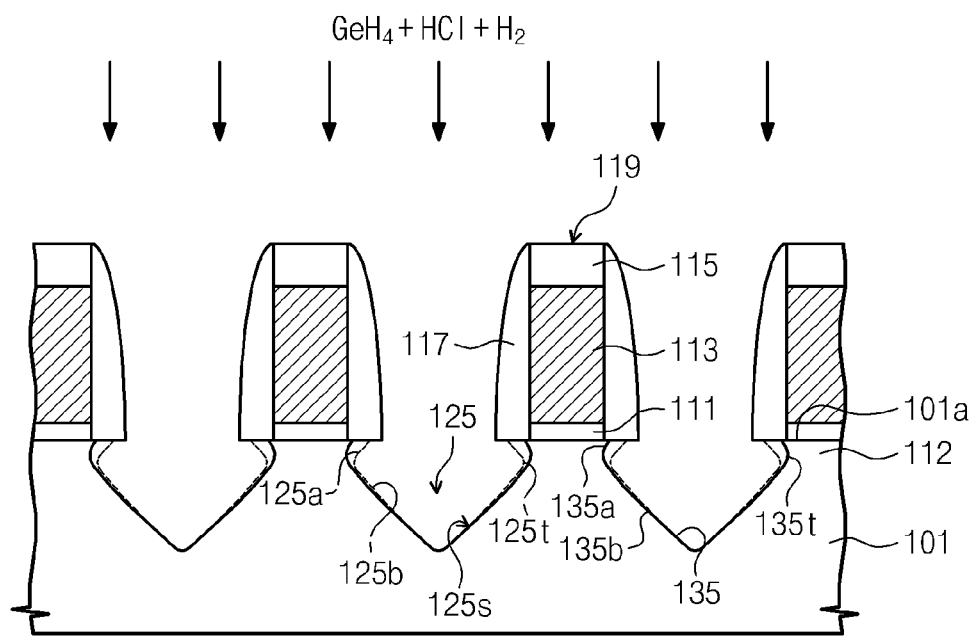
Figure 1E:
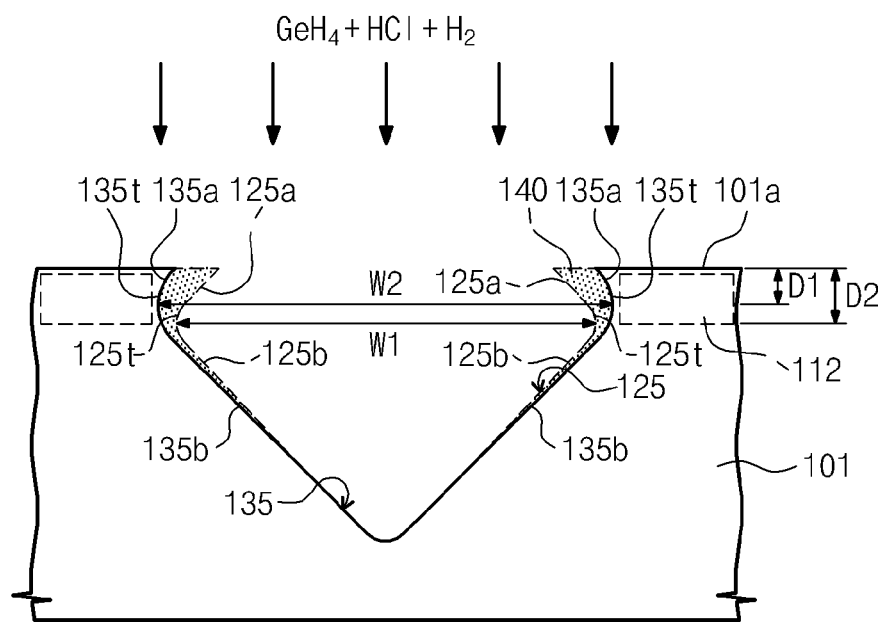
Figure 1F:
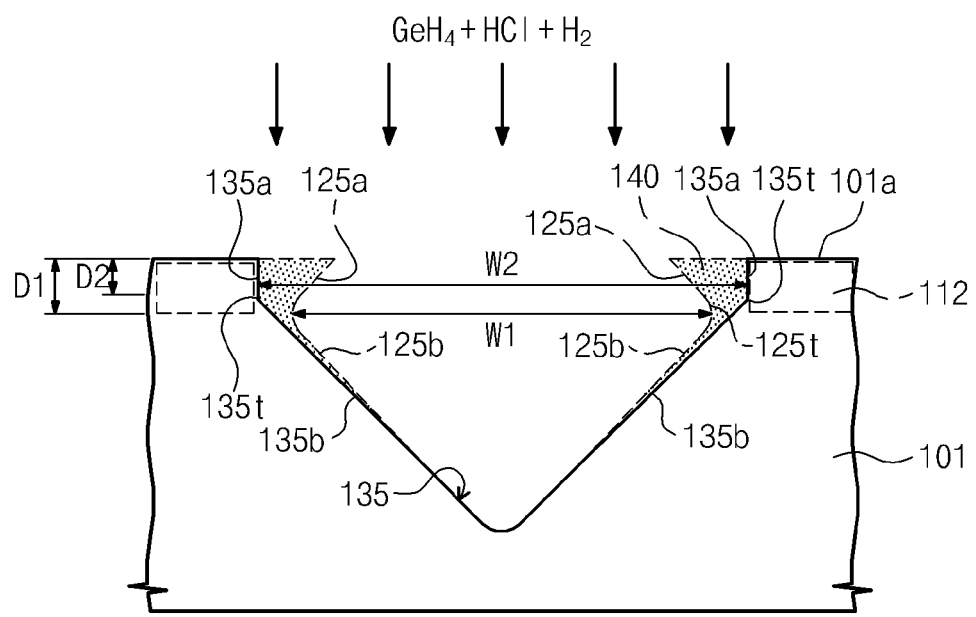
Figure 1G:
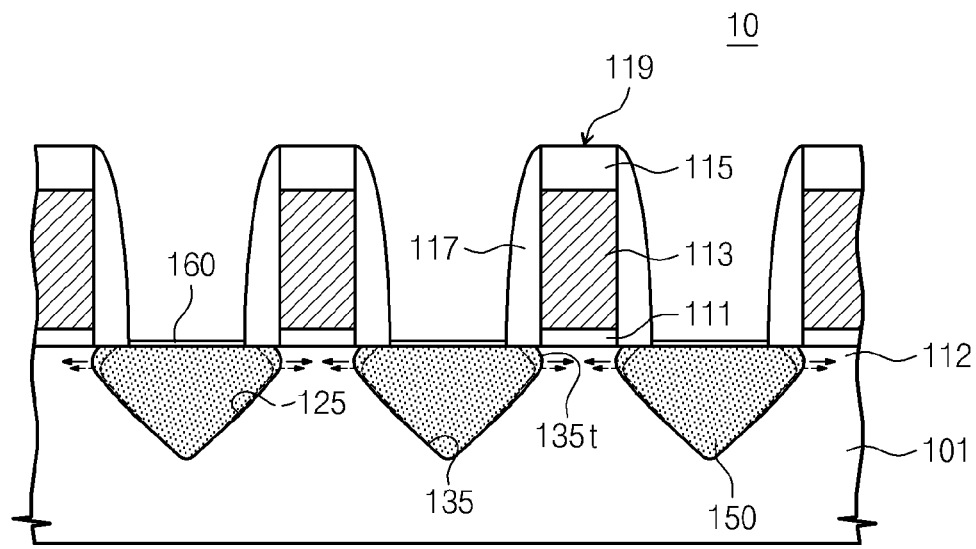
Figure 1H:
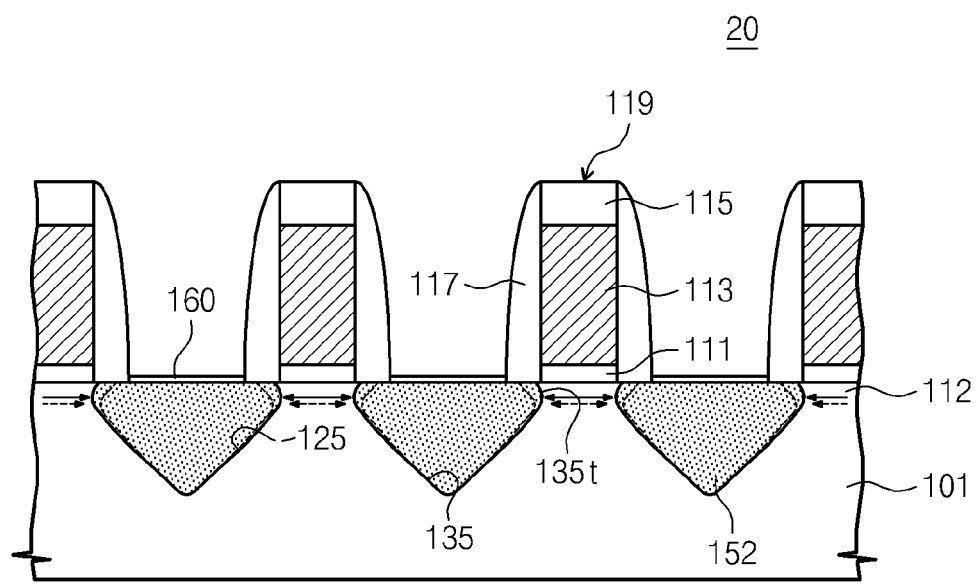
Figure 2A:
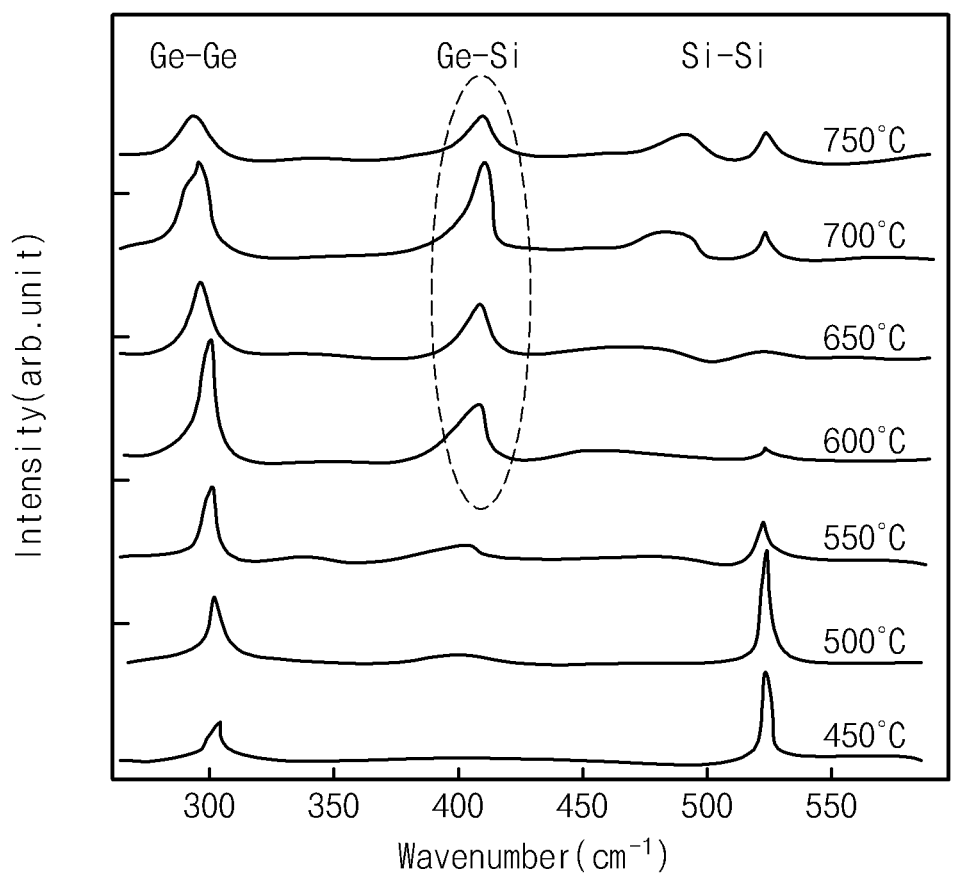
FIG. 2A is a graph illustrating an exemplary intermixing phenomenon of Ge and Si, which may be caused by methods of fabricating a semiconductor device according to example embodiments.
Figure 2B:
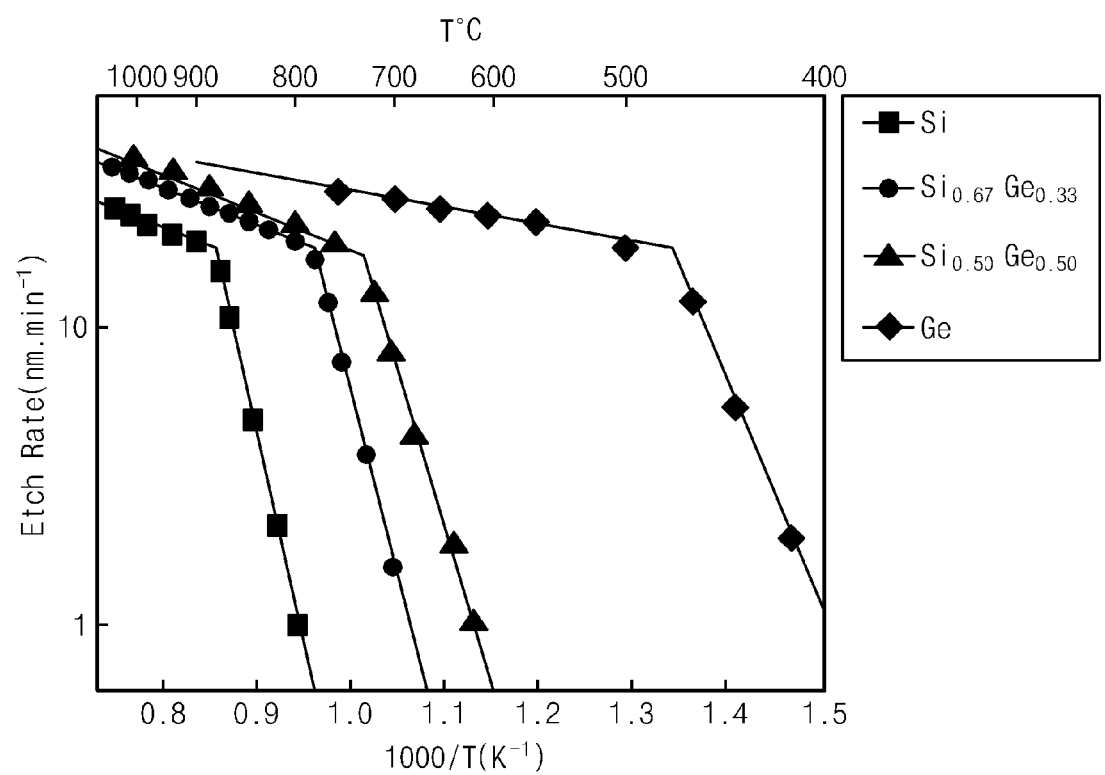
FIG. 2B is a graph illustrating a difference in etch rate between silicon and silicon-germanium in methods of fabricating a semiconductor device according to example embodiments.

FIGS. 1A through 1H are sectional views illustrating methods of fabricating a semiconductor device according to example embodiments, and FIGS. 1E and 1F are enlarged sectional views of an exemplary portion of the semiconductor device shown in FIG. 1D. FIG. 2A is a graph illustrating an exemplary intermixing phenomenon of Ge and Si. FIG. 2B is a graph illustrating a difference in etch rate between silicon and silicon-germanium in methods of fabricating a semiconductor device according to example embodiments.

Referring to FIG. 1A, a semiconductor substrate 101 may be provided. The semiconductor substrate 101 may comprise material with a semiconductor property, such as silicon. For instance, the semiconductor substrate 101 may include a silicon wafer with a (100) crystal plane. At least one gate electrode structure 119 may be formed on a surface 101a of the semiconductor substrate 101. The surface 101a may have the (100) crystal plane. A gate insulating layer 111 may be formed on the semiconductor substrate 101, and a gate 113 may be formed on the gate insulating layer 111. In some embodiments, gate spacers 117 may be formed on sidewalls of the gates 113. In some embodiments, the gate insulating layer 111 includes at least one of an oxide layer (e.g., $SiO_2$), a nitride layer (e.g., SiN, $Si_3N_4$, and SiON), or a high-k dielectric (e.g., $HfO_2$, and $ZrO_2$). The gate 113 may include a doped polysilicon layer, an undoped polysilicon layer, a metal layer, or any combination thereof. For instance, the gate 113 for an NMOS transistor may include a polysilicon layer doped with arsenic (As) and/or phosphorus (P), and the gate 113 for a PMOS transistor may include a polysilicon layer doped with boron (B). The gate spacer 117 may be formed of an oxide layer, a nitride layer, or any combination thereof. On the gate 113, there may further be a hard mask layer 115, which may be formed of an oxide layer, a nitride layer, or any combination thereof. A portion of the semiconductor substrate 101, which is located below the gate electrode structure 119, may serve as a channel 112 or a pathway for carrier transport.

Referring to FIG. 1B, first trenches 123 are formed by etching portions of the semiconductor substrate 101 which are exposed between the gate electrode structures 119. In some embodiments, an isotropic dry etching technique is used to form the trenches 123 in the semiconductor substrate 101. The isotropic dry etching technique may be performed using an etchant having high reactivity with the silicon of the semiconductor substrate 101. The etchant may be, for example, a mixture gas plasma of hydrogen bromide (HBr) and chlorine ($Cl_2$), a mixture gas plasma of sulphur hexafluoride ($SF_6$) and chlorine ($Cl_2$), or a mixture gas plasma of hydrogen bromide (HBr), chlorine ($Cl_2$), and sulphur hexafluoride ($SF_6$).

In some embodiments, portions of the semiconductor substrate 101 exposed between the gate spacers 117 are vertically etched at an initial stage of the isotropic dry etching process. Portions of the semiconductor substrate 101 located below the gate spacers 117 may be laterally and vertically etched as the isotropic dry etching process progresses. In these embodiments, portions of the semiconductor substrate 101 may be undercut below the gate electrode structure 119 to form the first trench 123 having, for instance, an elliptical vertical section. In other embodiments, the formation of the first trench 123 may include forming recess regions 121 using an anisotropic dry etching process and then laterally enlarging the recess regions 121 using the isotropic dry etching process. The anisotropic dry etching process may be performed using a mixture gas plasma of, for example, fluorine (F), carbon (C), oxygen (O) and argon (Ar). The mixture plasma gas may be, for instance, $CF_4/O_2$/Ar plasma or $CHF_3/O_2$/Ar plasma.

Referring to FIG. 1C, second trenches 125 are formed in the semiconductor substrate 101. The formation of the second trench 125 may include, for instance, enlarging the first trench 123 using a wet etching process. In certain embodiments, the wet etching process is performed using, for example, ammonium hydroxide ($NH_4OH$), tetramethylammonium hydroxide (TMAH; $(CH_3)_4NOH$), potassium hydroxide (KOH), sodium hydroxide (NaOH), BTMH (benzoic acid [(thiophen-2-yl)methylene]hydrazide), amine etchant, or any combination thereof. In an embodiment where a single-crystal silicon is used for the semiconductor substrate 101, a (111) crystal plane may have a relatively high density compared with other crystal planes, and therefore, an amount of the (111) crystal plane that is etched may be saturated during the wet etch process. A (111) crystal plane may have a much higher resistance to being etched than a (100) crystal plane. For example, potassium hydroxide (KOH) may display an etch rate selectivity for silicon around 400 times higher in a <100> crystal direction than in a <111> crystal direction. Other etchants may display a etch rate selectivity ranging from 17 to 400 times higher for silicon in a <100> crystal direction as compared to a <111> crystal direction.

In this embodiment, after the wet etch process, the second trench 125 may have a sigma (Σ) profile formed mainly by first and second planes 125a and 125b, where both the first and second planes 125a and 125b have the (111) crystal plane. The sigma (Σ) profile may refer to the shape of a trench. For example, the second trench 125 and/or the third trench 135 may have a sigma (Σ) profile shape. In one embodiment, the shape of a trench (e.g. 125) may include one or more bottom planes (e.g. two second planes 125b) and two side planes (e.g. two first planes 125a) that extend from a substrate surface (e.g. 101a) at an angle to intersect a top end of the bottom planes respectively (e.g. two second planes 125b). In one embodiment, the bottom end of the bottom planes may intersect a third plane (e.g. 125c). In one embodiment, the bottom ends of the bottom planes (e.g. two second planes 125b) may meet each other.

In one embodiment, the first plane 125a and the second plane 125b of the second trench 125 meet with each other at a tip 125t. The first plane 125a and the second plane 125b may intersect an angle A1. The tip 125t may be formed at an elevation in the substrate 101 lower than the channel 112. The tip 125t may sharply protrude toward the channel 112 in a horizontal direction. In some embodiments, the second planes 125b contact each other in such a way that a bottom of the second trench 125 may have a sharp profile. In other embodiments, the bottom surface of the second trench 125 may be defined by a third plane 125c with (100) crystal plane. Alternatively, by adjusting a process time in the wet etching process, the second trench 125 may be formed not to have the third plane 125c. The opposing second planes 125b may meet with each other at the bottom of the trench 125.

Referring to FIG. 1D, third trenches 135 are formed. In one embodiment, the third trenches 135 are formed by enlarging the second trenches 125. The first plane 135a may have the (111) crystal plane as shown in FIG. 1E or a (010) crystal plane as shown in FIG. 1F. A second plane 135b of the third trench 135 may have the (111) crystal plane. The etched amount of the second plane 135b may be lower than the etched amount of the first plane 135a.

Figure 1I:
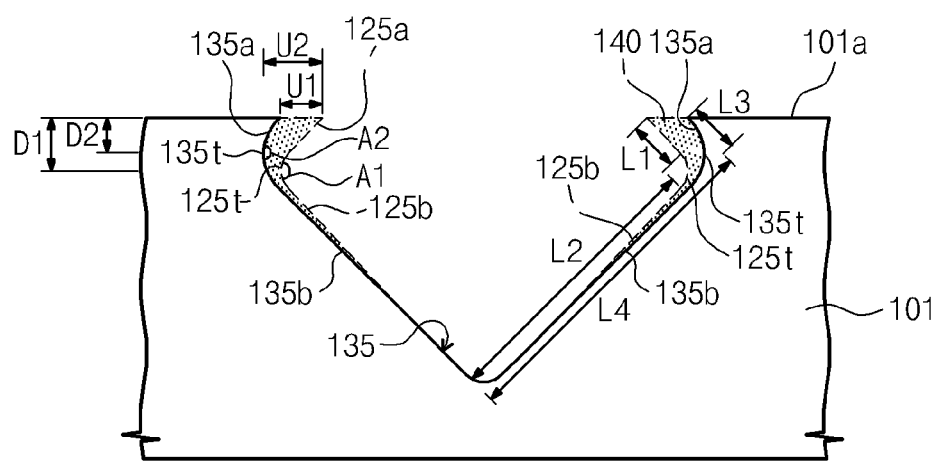
Figure 1J:
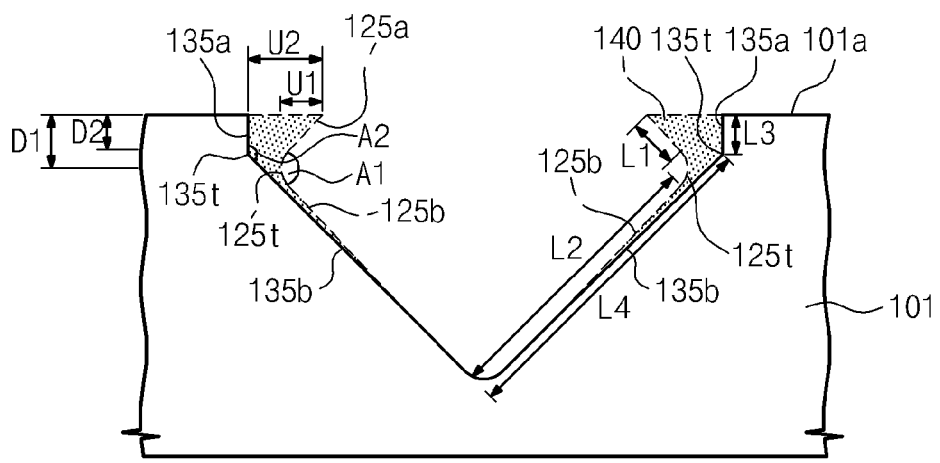

FIG. 1I is an enlarged view of FIG. 1E. FIG. 1J is an enlarged view of FIG. 1F. Referring to FIGS. 1I and 1J, in one embodiment, the first plane 125a and the second plane 125b of the second trench 125 intersect at a first tip angle A1. In one embodiment, the first plane 135a and the second plane 135b of the third trench 135 intersect at a second tip angle A2. In some embodiments, the first and second planes 125a, 125b may not intersect to form a perfect angle. For example, in some embodiments, the first plane 125a may be slightly curved. In these embodiments, the angle A1 is formed at the intersection of the second plane 125b and a tangent of the curved first plane 125a that extends from the intersection of the first plane 125a and the top surface 101a of the semiconductor substrate 101. In some embodiments, the first and second planes 135a, 135b may not intersect to form a perfect angle. For example, in some embodiments, the first plane 135a may be slightly curved. In these embodiments, the angle A2 is formed at the intersection of the second plane 135b and a tangent of the curved first plane 135a that extends from the intersection of the first plane 135a and the top surface 101a of the semiconductor substrate 101.

In some embodiments, the first plane 125a may extend in a straight line from the top surface 101a of the semiconductor substrate 101 and may curve slightly when it intersects with the second plane 125b, to form a tip 125t that is slightly curved. In these embodiments, the angle A1 is the angle formed from the intersection of the first plane 125a and the second plane 125b if the first plane 125a were a completely straight line. In some embodiments, the second plane 125b may extend in a straight line from a bottom of the second trench 125 and may curve slightly when it intersects with the first plane 125a, to form a tip 125t that is slightly curved. In these embodiments, the angle A1 is the angle formed from the intersection of the first plane 125a and the second plane 125b if the second plane 125b were a completely straight line.

In some embodiments, the first plane 135a may extend in a straight line from the top surface 101a of the semiconductor substrate 101 and may curve slightly when it intersects with the second plane 135b, to form a tip 135t that is slightly curved. In these embodiments, the angle A2 is the angle formed from the intersection of the first plane 135a and the second plane 135b if the first plane 135a were a completely straight line. In some embodiments, the second plane 135b may extend in a straight line from a bottom of the third trench 135 and may curve slightly when it intersects with the first plane 135a, to form a tip 135t that is slightly curved. In these embodiments, the angle A2 is the angle formed from the intersection of the first plane 135a and the second plane 135b if the second plane 135b were a completely straight line.

In some embodiments, the angle A2 is larger than the angle A1. For example, the angle A1 may range from 70 to 110 degrees, and the angle A2 may range from 90 to 150 degrees. In another example, the angle A2 may be between 5 and 40 degrees larger than the angle A1. In some embodiments, the second trench 125 is a conventional trench 125 and the angle A1 is limited by the conventional methods of trench production to be no greater than 90 degrees. In these embodiments, the angle A2 is greater than the conventionally limited size of A1. For example, the angle A2 is greater than 90 degrees. In some examples, the angle A2 may have a size up to 150 degrees. The sizes and difference in sizes of angles A1 and A2 are not limited to the examples described herein.

In one embodiment, the length L1 is the length along the first plane 125a from the top surface 101a of the semiconductor substrate 101 to its intersection with the second plane 125b. In one embodiment, the length L2 is the length along the second plane 125b from its intersection with the first plane 125a to the bottom of the second trench 125. In one embodiment, the length L3 is the length along the first plane 135a from the top surface 101a of the semiconductor substrate 101 to its intersection with the second plane 135b. In one embodiment, the length L4 is the length along the second plane 135b from its intersection with the first plane 135a to the bottom of the trench 135.

In one embodiment, the length L1 along the first plane 125a of the second trench 125 is shorter than the length L3 along the first plane 135a of the third trench 135. In one embodiment, the length L2 along the second plane 125b of the second trench 125 is the same length or shorter than the length L4 along the second plane 135b of the third trench 135. In one embodiment, the combined lengths L1+L2 along the first and second planes 125a, 125b of the second trench 125 are shorter than the combined lengths L3+L4 along the first and second planes 135a, 135b of the third trench 135. In one embodiment, the combined lengths L1+L2 along the first and second planes 125a, 125b of the second trench 125 is less than 90% of the combined lengths L3+L4 along the first and second planes 135a, 135b of the third trench 135.

In one embodiment, portions of the semiconductor substrate 101 may be undercut more by the formation of the third trench 135 than the formation of the second trench 124. For example, the undercut U1 may be produced by the formation of the second trench 125 and the undercut U2 may be produced by the formation of the third trench 135. In one embodiment, the undercut U2 produced by the formation of the third trench 135 may be 50% larger than the undercut U1 produced by the formation of the second trench 125. In some embodiments, the undercut produced by the formation of the third trench 135 may be between 25% and 125% larger than the undercut produced by the formation of the second trench 125.

As mentioned above, FIGS. 1I and 1J show a cross-sectional view of an exemplary semiconductor device. In this view, the area created by producing the third trench 135 is larger than the area created by producing the second trench 125. Correspondingly, the volume created by producing the third trench 135 may be larger than the volume created by producing the second trench 125. For example, the area (or corresponding volume) of the third trench 135 may be 20% larger than the area of the second trench 125. Similarly, the amount of substrate removed to form the third trench 135 may be larger than the amount of substrate removed to form the second trench 125. For example, 20% more of the substrate may have been removed when enlarging the second trench 125 to form the third trench 135. In some embodiments, the area (or corresponding volume) created by producing the third trench 135 may be between 10 and 50% larger than the area (or corresponding volume) created by producing the second trench 125. In these embodiments, between 10% and 50% more of the substrate may have been removed when enlarging the second trench 125 to form the third trench 135.

The third trench 135 may be formed, for example, during a pre-bake process that is performed after the second trench 125 is formed. The formation of the third trench 135 may include etching the semiconductor substrate 101 using a reaction gas containing germanium tetrahydride (GeH4), hydrogen chloride (HCl), and/or hydrogen (H2). The germanium tetrahydride (GeH4) may be supplied to provide germanium (Ge) onto the semiconductor substrate 101, and the hydrogen chloride (HCl) may be supplied to provide chlorine (Cl) for removing silicon-germanium (SiGe). The hydrogen (H2) may be supplied to adjust a concentration of germanium (Ge) on the semiconductor substrate 101.

In some embodiments, the etching of the semiconductor substrate 101 is performed under a pressure of about 1 Torr to about 100 Torr at a temperature of about 600° C. to about 900° C. During the etching of the semiconductor substrate 101, the germanium tetrahydride (GeH$_4$) may be supplied with a flow rate of about 15 sccm or more under a partial pressure of about 0.15 mTorr or more. The concentration of germanium (Ge) on the semiconductor substrate 101 may be adjusted to about 5%. The hydrogen chloride (HCl) may be supplied with a flow rate of about 100 sccm to about 150 sccm under a partial pressure of about 30 mTorr or more. The hydrogen (H$_2$) may be supplied with a flow rate of about 1 slm to about 50 slm. In some embodiments, the hydrogen (H$_2$) may be supplied with a flow rate of about 20 slm to about 40 slm.

In some embodiments, the etching process using the reaction gas is performed under process conditions described in the following table 1.

TABLE 1

|  | Example 1 | Example 2 | Partial Pressure (mTorr) |
|---|---|---|---|
| Pressure | 10 Torr | 10 Torr | — |
| H$_2$ | 40,000 sccm | 20,000 sccm | 9,962/9,950 |
| GeH$_4$ | 15 sccm (5%) | 15 sccm (5%) | 0.19/0.37 |
| HCl | 150 sccm | 100 sccm | 37/50 |

In some embodiments, the third trench 135 may be formed by etching the second trench 125. The formed third trench 135 may include the second trench 125, and may be an expansion of the second trench 125 as a result of the etching process. The expansion of the profile of the second trench 125 to form the third trench 135 will be described with reference to FIG. 1E. In some embodiments, both the second trench 125 and the third trench 135 have a sigma ($\Sigma$) profile. In some embodiments, the first planes 125a of the second trench 125 and the first planes 135a of the third trench 135 have (111) crystal planes. In these embodiments, the second planes 125b of the second trench 125 and the second planes 135b of the third trench 135 have the (111) crystal planes. In some embodiments, the first planes 125a of the second trench 125 have the (111) crystal planes and the first planes 135a of the third trench 135 have the (010) planes. The first planes 135a having the (010) planes may be able to apply a stress to the channel region better than the first planes 125(a) having the (111) planes. In these embodiments, the second planes 125b of the second trench 125 and the second planes 135b of the third trench 135 have the (111) crystal planes.

FIG. 1E is an enlarged sectional view illustrating a portion of the exemplary semiconductor device shown in FIG. 1D.

Referring to FIG. 1E in conjunction with FIG. 1D, a silicon-germanium (SiGe) layer 140 is grown from the surface of the second trench 125. The growth of the silicon-germanium (SiGe) layer 140 may occur based on an intermixing of germanium (Ge), which may be present from a decomposition of the germanium tetrahydride (GeH$_4$), and silicon (Si) atoms of the semiconductor substrate 101.

In detail, FIG. 2A shows relative intensities of Si—Ge peaks measured from silicon surfaces with the (111) crystal plane, on which germanium tetrahydride (GeH$_4$) gases were supplied. The germanium tetrahydride (GeH$_4$) gases may be supplied at a flow rate of about 5 sccm, under different growing temperatures, for about 30 minutes. In one embodiment, the reaction gas may start to be consumed at an upper portion of the second trench 125. In this embodiment, the silicon-germanium (SiGe) layer 140 may first begin to be grown at the first planes 125a that are upper planes of the (111) crystal planes. In some embodiments, the silicon-germanium (SiGe) layer 140 may be grown to have a greater thickness on the first planes 125a than on the second planes 125b. Meanwhile, in this embodiment, the etching of silicon-germanium (SiGe), caused by the chlorine gas originated from the hydrogen chloride (HCl), may start to occur at the upper portion of the second trench 125. In some embodiments, the amount of silicon-germanium (SiGe) removed from the upper planes 125a of the second trench 125 is greater than the amount of silicon-germanium removed from the second planes 125b.

As shown in FIG. 2B, for the same temperature condition, an etch rate of SiGe by the hydrogen chloride gas may be much greater than that of silicon. The etching of silicon-germanium (SiGe) may start to occur at the upper portion of the second trench 125, and the third trench 135 may be formed to have a second width W2 that is greater than a first width W1 of the second trench 125. The third trench 135 may have a tip 135t located at a higher point in the substrate 101 than the tip 125t of the second trench 125. In one embodiment, the formation of the silicon-germanium (SiGe) layer 140 based on the intermixing of Ge and Si may be performed in conjunction with the etching of silicon-germanium (SiGe) caused by the chlorine gas, in an in-situ manner.

In some embodiments, the tip 135t may be more adjacent to the channel 112 and to the surface 101a of the semiconductor substrate 101, when compared with the tip 125t of the second trench 125. For example, the distance between the tip 135t and the surface 101a may be smaller than the distance between the tip 125t and the surface 101a. The height of the tip 135t may place it closer to the channel 112 than the tip 125t. In one embodiment, the distance D1 between the surface 101a of the substrate 101 and the tip 125t may be larger than the distance D2 between the surface 101a of the substrate 101 and the tip 135t. For example, the distance D1 may be between 10% and 25% greater than the distance D2. In some embodiments, the distance D1 is at least 10% greater than the distance D2.

The first width W1 may refer to a distance between a pair of the tips 125t in the second trench 125, and the second width W2 may refer to a distance between a pair of the tips 135t in the third trench 135. In one embodiment, the first width W1 is less than the second width W2. In one embodiment, the first width W1 is at least 10% less than the second width W2. In some embodiments, the first width W1 may be between 10% and 25% less than the second width W2.

In some embodiments, the sigma ($\Sigma$) profile of the third trench 135 may be strongly dependent on a partial pressure of hydrogen chloride (HCl), compared with other process conditions. For instance, when other process conditions are maintained or changed and a partial pressure of hydrogen chloride (HCl) is increased, the first plane 125a of the second trench 125 may be selectively etched. For example, in some embodiments, the first plane 125a may be selectively etched when a reaction gas (GeH$_4$+HC+H$_2$) meets the first plane 125a before the second plane 125b, as described above with reference to FIG. 2A. In these embodiments, the first plane 125a may be etch-damaged to a significantly greater extent than the second plane 125b such that the first plane 125a has more crystalline defects than the second plane 125b. The amount of Germanium (Ge) that is intermixed into the first plane 125a may be greater than the amount intermixed into the second plane 125b. As described above with respect to FIG. 2B, the etch rate of silicon-germanium (SiGe) by hydrogen chloride (HCl) may be greater than the etch rate of silicon (Si) by hydrogen chloride (HCl), meaning a larger portion of the first plane 125a may be etched as compared to the second plane 125b. In embodiments in which process conditions are maintained while increasing a partial pressure of hydrogen chloride (HCl), the partial pressure of hydrogen chloride (HCl) may be increased from 25 mTorr to 37 mTorr or to 50 mTorr. In one embodiment, the partial pressure of hydrogen chloride (HCl) is increased in two parts, from 25 mTorr to 37 mTorr and then to 50 mTorr. In an embodiment where the partial pressure of hydrogen chloride (HCl) is increased, the tip 135t of the third trench 135 may be able to be vertically elevated and horizontally widened, compared with the tip 125t of the second trench 125. In some embodiments, the first plane 135a may have the (111) crystal plane as shown in FIG. 1E or a (010) crystal plane as shown in FIG. 1F. A second plane 135b of the third trench 135 may have the (111) crystal plane as the second plane 125b of the second trench 125. The etched amount of the second plane 135b may be lower than the etched amount of the first plane 135a.

Referring back to FIG. 1D, in an embodiment where the second trench 125 is formed using the wet etching process, a native oxide layer (e.g., SiO$_2$) may be formed on the surface 125s. The native oxide layer may prevent or cause issues with the growth of a high quality epitaxial layer. In some embodiments, it may be necessary to remove the native oxide layer. For instance, the native oxide layer may be removed by a bake process using hydrogen (H$_2$), which may be performed at a temperature of about 1000° C. or more. Removing the native oxide layer using a bake process at a temperature of about 1000° C. or more may result in technical difficulties. For example, there may be issues with the thermal budget of the semiconductor device and/or migration of silicon atoms. During the bake process, thermal energy may be transferred to the wafer that enables, for example, redistribution of atoms like silicon or dopants. The thermal budget may refer to a cap in the amount of thermal energy that the semiconductor may have before a damaging redistribution of the silicon atom or other issues arise. Redistribution of atoms in the substrate 101 may result in a rounding of the tip 125t, such that the second trench 125 may not have a sigma ($\Sigma$) profile shape any more.

In some embodiments, the native oxide layer is instead removed using a germanium containing gas, e.g., germanium tetrahydride (GeH$_4$), at a temperature relatively lower than the hydrogen bake process described above. The germanium containing gas (e.g., GeH$_4$) may be reacted with the native oxide layer of SiO$_2$ to produce a volatile germanium oxide (e.g., GeO). In some embodiments, the native oxide layer may be removed by this chemical process. In an embodiment where the native oxide layer is removed using germanium tetrahydride (GeH$_4$), the germanium tetrahydride (GeH$_4$) may be supplied with a flow rate lower than that of the etching process (e.g., 15 sccm or more). In certain embodiments, during the removal of the native oxide layer, a hydrogen (H$_2$) gas is additionally supplied to control a concentration of germanium (Ge). In some embodiments, hydrogen chloride (HCl) is also supplied onto the substrate 101 during the removal of the native oxide layer. In these embodiments, the hydrogen chloride (HCl) may be used as an etchant for removing a germanium (Ge) layer, which may be deposited on the surface 125s of the second trench 125.

In some embodiments, in order to remove the native oxide layer, a mixture gas of, for example, germanium tetrahydride (GeH$_4$), hydrogen chloride (HCl), and hydrogen (H$_2$) is supplied onto the semiconductor substrate 101 under a pressure of about 1 Torr to about 100 Torr at a temperature of about 500° C. to about 800° C. for about 1 sec to about 120 sec. In some embodiments, the mixture gas is supplied at a temperature of about 500° C. to about 700° C. or about 650° C. to about 700° C. During this process, the hydrogen ($H_2$) may be supplied with a flow rate of, for example, about 30 slm to about 50 slm, the hydrogen chloride (HCl) may be supplied with a flow rate of, for example, about 150 sccm or more, and the germanium tetrahydride ($GeH_4$) may be supplied with a flow rate of, for example, about 0.75 sccm or more.

A ratio in flow rate of the hydrogen chloride (HCl) to the germanium tetrahydride ($GeH_4$) may be, for example, 150 or more. In some embodiments, the ratio in flow rate is around 200. A partial pressure of the germanium tetrahydride ($GeH_4$) may be controlled to be about 0.3 mTorr or less. In some embodiments, a partial pressure of the hydrogen chloride (HCl) may be greater than that of the germanium tetrahydride ($GeH_4$). For instance, a ratio in partial pressure of the hydrogen chloride (HCl) to the germanium tetrahydride ($GeH_4$) may be about 150 or more.

Referring to FIGS. 1G and 1H, a material with a different lattice constant from silicon (Si) may be epitaxially grown from the third trench 135. In some embodiments, a compressive stress caused by this lattice constant difference may be exerted on the channel 112, as shown in a semiconductor device 10 of FIG. 1G. In other embodiments, a tensile stress caused by this lattice constant difference may be exerted on the channel 112, as shown in a semiconductor device 20 of FIG. 1H. At least one of the semiconductor devices 10 and 20 may include at least one memory element. In some embodiments, the semiconductor devices 10 and 20 may be used to realize, for example, a memory card, a mobile device, or a computer.

In more detail, referring to FIG. 1G, the third trench 135 may be filled with silicon-germanium (SiGe) to form a junction region 150. The formation of the junction region 150 may include epitaxially growing a silicon-germanium layer from the third trench 135 and then doping the silicon-germanium layer with boron (B) atoms. Alternatively, the junction region 150 may be formed by epitaxially growing a boron-doped silicon-germanium layer. In one embodiment, the junction region 150 of silicon-germanium (SiGe) may have a greater lattice constant than the channel 112 of silicon (Si). In this embodiment, the junction region 150 may exert a compressive stress on the channel 112. In this embodiment, PMOS transistors of the semiconductor device 10 may have increased mobility of majority carriers (i.e., holes). According to some embodiments, the junction region 150 may be formed by filling the third trench 135 having the elevated tip 135t with a SiGe layer. In these embodiments, a distance between the tips 135t disposed in different third trenches 135 may be reduced, compared with the case of the second trenches 125. The SiGe layer filling the third trench 135 may exert a strong compressive stress (depicted by a solid arrow line) on the channel 112, compared with when the SiGe layer fills the second trench 125 (depicted by a dotted arrow line). In some embodiments, a silicide layer 160 may be additionally formed on the junction region 150 to reduce a contact resistance between the junction region 150 and a plug (not shown) that is coupled thereto.

Referring to FIG. 1H, a junction region 152 may be formed by filling the third trench 135 with a silicon-carbide (SiC) layer. The formation of the junction region 152 may include epitaxially growing a silicon-carbide layer from the third trench 135 and then doping the silicon-carbide layer with phosphorus (P) or arsenic (As) atoms. Alternatively, the junction region 152 may be formed by epitaxially growing a phosphorus (P) or arsenic (As)-doped silicon-carbide layer. In one embodiment, the junction region 152 of silicon-carbide (SiC) may have a smaller lattice constant than the channel 112 of silicon (Si). In this embodiment, the junction region 152 may exert a tensile stress on the channel 112. In this embodiment, NMOS transistors of the semiconductor device 20 may have increased mobility of majority carriers (i.e., electrons). According to some embodiments, the junction region 152 may be formed by filling the third trench 135 having the elevated tip 135t with a SiC layer. The SiC layer filling the third trench 135 may exert a strong tensile stress (depicted by a solid arrow line) on the channel 112, compared with when the SiC layer fills the second trench 125 (depicted by a dotted arrow line). In some embodiments, the silicide layer 160 may be additionally formed on the junction region 152 to reduce a contact resistance between the junction region 152 and a plug (not shown) coupled thereto.

Applications of Embodiments

Figure 3A:
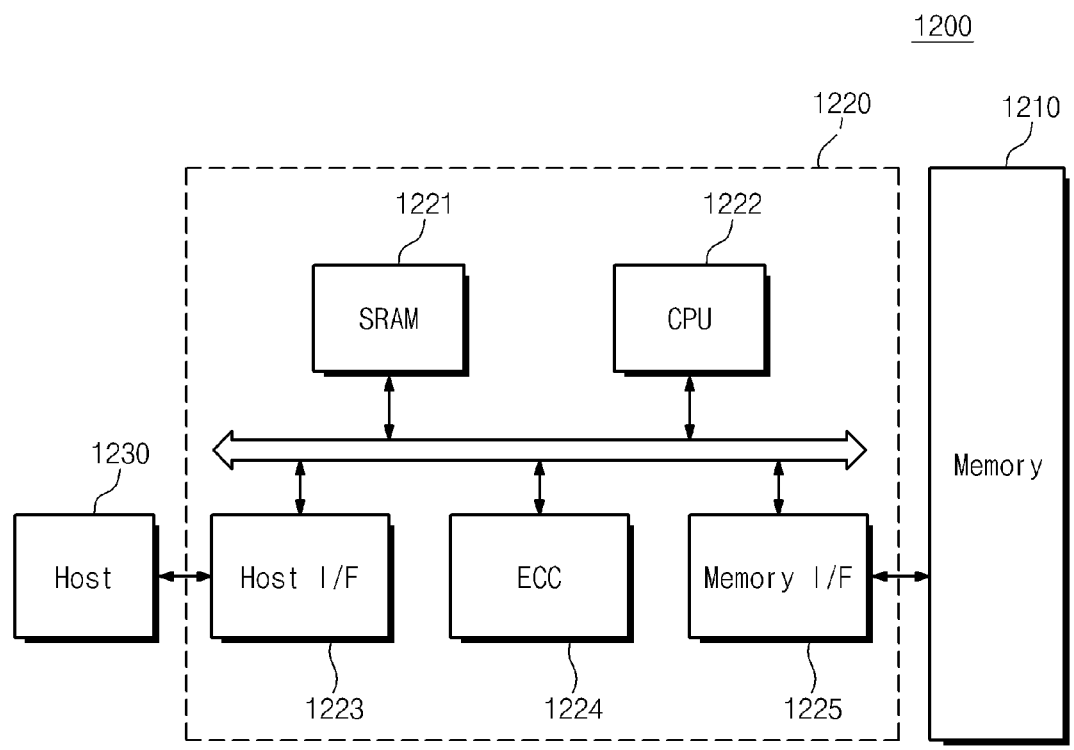
FIG. 3A is a block diagram illustrating a memory card including a semiconductor device according to example embodiments.
Figure 3B:
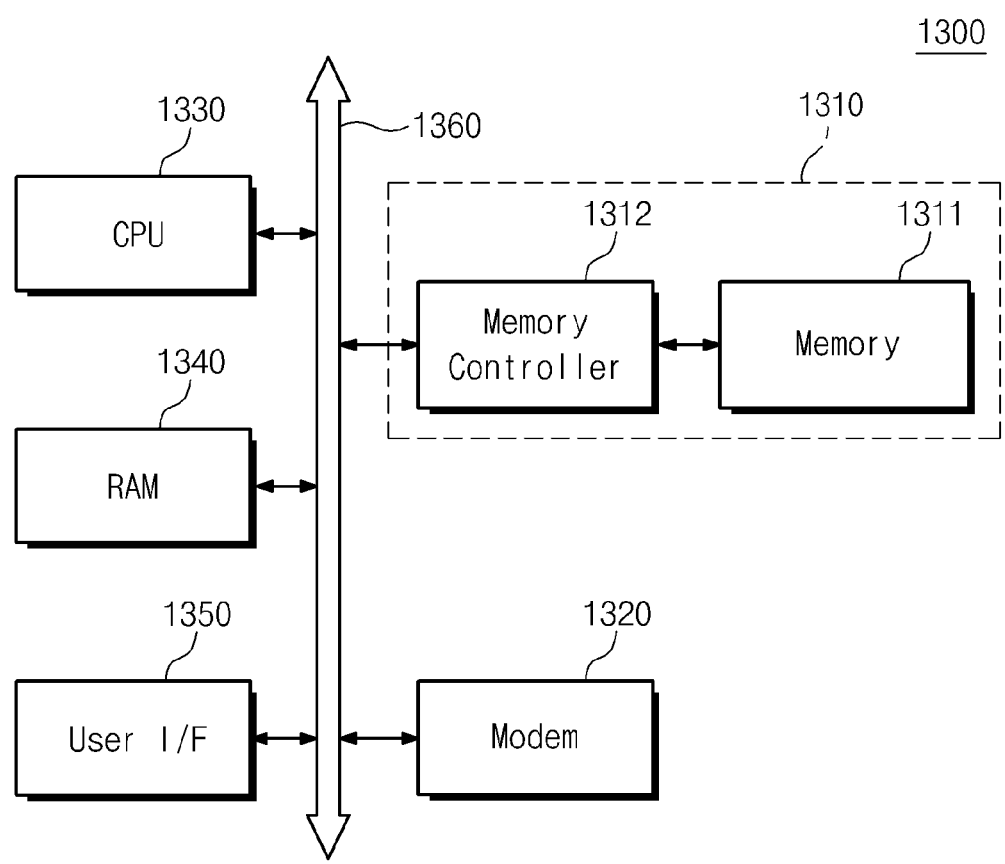
FIG. 3B is a block diagram illustrating an information processing system including a semiconductor device according to example embodiments.

FIG. 3A is a block diagram illustrating a memory card including an exemplary semiconductor device. FIG. 3B is a block diagram illustrating an information processing system including an exemplary semiconductor device.

Referring to FIG. 3A, a memory card 1200 may be realized using a memory device 1210 including at least one of the semiconductor devices 10 and 20. In some embodiments, the memory card 1200 may include a memory controller 1220 controlling general data exchanges between a host and the memory device 1210. A static random access memory (SRAM) 1221 may be used as an operating memory of a processing unit 1222. A host interface 1223 may include a data exchange protocol of a host connected to a memory card 1200. An error correction block 1224 may detect and correct errors included in data read from a multi-bit memory device 1210. A memory interface 1225 may interface with the memory device 1210. A processing unit 1222 may perform general control operations for data exchange of the memory controller 1220.

Referring to FIG. 3B, an information processing system 1300 may be realized using a memory system 1310 including at least one of the semiconductor devices 10 and 20. For instance, the information processing system 1300 may be a mobile device and/or a desktop computer. In some embodiments, the information processing system 1300 may further include a modem 1320, a central processing unit (CPU) 1330, a RAM 1340, and a user interface 1350, which are all electrically connected to a system bus 1360. A memory system 1310 may also be electrically connected to the system bus 1360. The memory system 1310 may include a memory device 1311 and a memory controller 1312. In some embodiments, the memory system 1310 may be configured substantially identical to the memory system described with respect to FIG. 3A. Data processed by the CPU 1330 and/or input from the outside may be stored in the memory system 1310. In some embodiments, the memory system 1310 may be used as a portion of a solid state drive (SSD). In these embodiments, the information processing system 1300 may stably and reliably store a large amount of data in the memory system 1310. Although not illustrated, an application chipset, a camera image sensor, a camera image signal processor (ISP), an input/output device, or the like may further be included in the information processing system 1300.

According to example embodiments, a portion of a sigma (Σ) shaped trench may be selectively removed using germanium tetrahydride ($GeH_4$) and hydrogen chloride (HCl). This removal process may form a trench tip at an elevated position and expand the sigma (Σ) shaped trench, placing the trench tip closer to a channel region. With the elevated tip, it may be possible to effectively apply a stress to the channel region of transistor, to increase carrier mobility of the semiconductor device, and to improve performance of transistors.

The above-disclosed subject matter is to be considered illustrative and not restrictive, and the appended claims are intended to cover all such modifications, enhancements, and other embodiments, which fall within the true spirit and scope of the disclosed embodiments. Thus, the invention is to be construed by the broadest permissible interpretation of the following claims and their equivalents, and shall not be restricted or limited by the foregoing detailed description.

What is claimed is:

1. A method of fabricating a semiconductor device, comprising the steps of:
   providing a semiconductor substrate including a channel region;
   forming at least a first gate electrode structure on the channel region of the semiconductor substrate;
   forming a first trench in the semiconductor substrate at a first side of the first gate electrode structure, the first trench including at least a first plane that extends from a top surface of the semiconductor substrate, the first plane having a (111) crystal plane, at least a second plane that intersects the first plane, the second plane having a (111) crystal plane, and at least a first tip, the first tip defined by the intersection of the first plane and the second plane; and
   enlarging the first trench to form a second trench, the second trench including at least a third plane that intersects the top surface of the semiconductor substrate, at least a fourth plane that intersects the third plane, and at least a second tip, the second tip defined by the intersection of the third plane and the fourth plane forming the second tip nearer to a top surface of the semiconductor substrate than the first tip,
   wherein the step of enlarging the first trench to form the second trench comprises the step of:
      etching the first plane and the second plane to form the third plane and the fourth plane, wherein an etch rate of the first plane is higher than an etch rate of the second plane.

2. The method of claim 1, wherein the step of enlarging the first trench to form the second trench comprises the step of:
   forming the second tip to have a second tip angle that is larger than a first tip angle of the first tip.

3. The method of claim 1, wherein the second tip is nearer to the channel region of the semiconductor substrate than the first tip.

4. The method of claim 3, wherein the step of etching the first plane and the second plane further comprises the steps of:
   growing a silicon-germanium layer on the first plane and the second plane, the silicon-germanium layer having a greater thickness on the first plane than on the second plane; and
   etching the silicon-germanium layer from the first plane and the second plane, wherein:
      the amount etched of the silicon-germanium layer from the first plane is greater than the amount etched from the second plane.

5. The method of claim 3, wherein the step of enlarging the first trench to form the second trench comprises the steps of:
   forming a semiconductor layer including germanium (Ge) on the first plane and the second plane by supplying germanium tetrahydride (GeH$_4$) onto the semiconductor substrate; and
   etching the semiconductor layer by supplying hydrogen chloride (HCl) onto the semiconductor substrate,
   wherein the amount of the semiconductor layer etched from the first plane is greater than the amount of the semiconductor layer etched from the second plane, and
   wherein the step of etching of the semiconductor layer is performed during the step of forming of the semiconductor layer in an in-situ manner.

6. The method of claim 1, further comprising the step of:
   filling the second trench with a material having a lattice constant different from the semiconductor substrate to form a junction region.

7. A method of fabricating a semiconductor device, comprising the steps of:
   forming at least a first gate electrode structure on a surface of a silicon-containing semiconductor substrate;
   forming a first trench in the semiconductor substrate, the first trench including at least a first plane that intersects a top surface of the semiconductor substrate, at least a second plane that intersects the first plane, and at least a first tip formed at the intersection of the first plane and the second plane, the first tip protruding toward a channel region disposed in the semiconductor substrate under the first gate electrode;
   enlarging the first trench to form a second trench, the second trench including at least a third plane that intersects the top surface of the semiconductor substrate, at least a fourth plane that intersects the third plane, and at least a second tip formed at the intersection of the third plane and the fourth plane;
   wherein the step of enlarging the first trench to form the second trench comprises the step of:
      etching the first plane and the second plane to form the third plane and the fourth plane,
   wherein a first distance from the first tip to the top surface of the semiconductor substrate is greater than a second distance from the second tip to the top surface of the semiconductor substrate.

8. The method of claim 7, wherein the step of enlarging the first trench to form the second trench comprises the step of:
   forming the second tip nearer to the channel region than the first tip.

9. The method of claim 7, wherein the step of enlarging the first trench to form the second trench comprises the step of:
   forming the second tip to have a second tip angle that is different from a first tip angle of the first tip.

10. The method of claim 7, wherein an undercut created by the step of enlarging the first trench to form the second trench is larger than an undercut created by the step of forming the first trench.

11. The method of claim 7, wherein the step of etching the first plane and the second plane comprises the steps of:
   forming a silicon-germanium layer on the first plane and the second plane, wherein the silicon-germanium layer is formed to have a greater thickness on the first plane than on the second plane; and
   etching the silicon-germanium layer from the first plane and from the second plane, wherein an etch amount of the silicon-germanium layer from the first plane is greater than that from the second plane,
   wherein the step of forming of the silicon-germanium layer and the step of etching of the silicon-germanium layer are performed in an in-situ manner.

12. The method of claim 7, wherein:
   the first plane, the second plane, and the fourth plane have a (111) crystal plane, and
   the third plane has a (111) or (010) crystal plane.

13. The method of claim 7, further comprising the step of:
filling the second trench with a material that exerts a stress on the channel.

14. The method of claim 7,
wherein the first trench includes at least a first set of planes that each intersect a top surface of the semiconductor substrate, at least a second set of planes that each intersect a respective one of the first set of planes, at least a first tip formed at the intersection of one of the first set of planes and one of the second set of planes, and at least a second tip formed at the intersection of the other one of the first set of planes and the other one of the second set of planes, the first tip and the second tip protruding outwards in opposite directions toward the channel region, wherein the second trench including at least a third set of planes that each intersect the top surface of the semiconductor substrate, at least a fourth set of planes that each intersect a respective one of the third set of planes, at least a third tip formed at the intersection of one of the third set of planes and one of the fourth set of planes, and at least a fourth tip formed at the intersection of the other one of the third set of planes and the other one of the fourth set of planes, the third and fourth tips protrude outwards in opposite directions towards the channel region, and wherein the third and fourth tips are disposed nearer to the channel region than the first and second tips.

15. The method of claim 14, wherein the width between the third and fourth tips is greater than the width between the first and second tips.

* * * * *